(12) United States Patent
Higashide et al.

(10) Patent No.: US 9,148,110 B2
(45) Date of Patent: Sep. 29, 2015

(54) TRANSMISSION MODULE

(71) Applicant: Murata Manufacturing Co., Ltd., Kyoto (JP)

(72) Inventors: Yuki Higashide, Kyoto (JP); Syunji Yoshimi, Kyoto (JP); Kenji Saito, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/561,342

(22) Filed: Dec. 5, 2014

(65) Prior Publication Data

US 2015/0091666 A1 Apr. 2, 2015

Related U.S. Application Data

(63) Continuation of application No. PCT/JP2013/068217, filed on Jul. 3, 2013.

(30) Foreign Application Priority Data

Jul. 19, 2012 (JP) .................................. 2012-160777

(51) Int. Cl.
| | |
|---|---|
| H01P 1/36 | (2006.01) |
| H03H 7/12 | (2006.01) |
| H03H 7/38 | (2006.01) |
| H03H 7/52 | (2006.01) |
| H03H 7/01 | (2006.01) |
| H03H 7/09 | (2006.01) |

(52) U.S. Cl.
CPC .. *H03H 7/12* (2013.01); *H01P 1/36* (2013.01); *H03H 7/38* (2013.01); *H03H 7/52* (2013.01); *H03H 7/09* (2013.01); *H03H 7/1741* (2013.01)

(58) Field of Classification Search
CPC ............... H01P 1/32; H01P 1/36; H01P 1/38; H01P 1/383

USPC .................................................. 333/1.1, 24.2
See application file for complete search history.

(56) References Cited

U.S. PATENT DOCUMENTS

| 7,532,084 B2 | 5/2009 | Wada |
| 2007/0030089 A1 | 2/2007 | Hino |
| 2009/0058551 A1* | 3/2009 | Wada et al. ................... 333/24.2 |

FOREIGN PATENT DOCUMENTS

| JP | 2009-302742 A | 12/2009 |
| JP | 2012-114547 A | 6/2012 |

(Continued)

OTHER PUBLICATIONS

International Search Report issued in Application No. PCT/JP2013/068217 dated Aug. 27, 2013.

(Continued)

*Primary Examiner* — Stephen E Jones
(74) *Attorney, Agent, or Firm* — Pearne & Gordon LLP

(57) ABSTRACT

As a capacitor Cj is connected in parallel to a non-reciprocal circuit 3, in a predetermined frequency band in which a power amplifier 2 is used, or in other words, in a predetermined frequency band used in communication, an input impedance of the non-reciprocal circuit 3 is adjusted and the length of an impedance curve (reflection coefficient S11) at an input terminal P2 of the non-reciprocal circuit 3 can thus be reduced. In addition, an output impedance of the power amplifier 2 and an input impedance of the non-reciprocal circuit 3 can be matched in a broad band through an interstage matching circuit 7 (input matching circuit 6) provided between an output terminal P1 of the power amplifier 2 and the input terminal P2 of the non-reciprocal circuit 3.

4 Claims, 8 Drawing Sheets

(56) References Cited

FOREIGN PATENT DOCUMENTS

| | | |
|---|---|---|
| JP | 2012-142855 A | 7/2012 |
| WO | 2006/080172 A1 | 8/2006 |
| WO | 2009/028112 A1 | 3/2009 |
| WO | 2012/172882 A1 | 12/2012 |

OTHER PUBLICATIONS

Written Opinion issued in Application No. PCT/JP2013/068217 dated Aug. 27, 2013.

* cited by examiner

PRIOR ART

TRANSMISSION MODULE

BACKGROUND OF THE INVENTION

1. Field of the Invention

The present invention relates to transmission modules that include an amplifier circuit, a non-reciprocal circuit, and an interstage matching circuit connected between an output end of the amplifier circuit and an input end of the non-reciprocal circuit.

2. Description of the Related Art

In recent years, there has been a demand for multiband and multimode portable communication terminals, such as cellular phones and portable information terminals, which are compatible with a plurality of communication modes using mutually different frequency bands or modulation methods. Thus, in a transmission module mounted in a transmission section of such a portable communication terminal, as illustrated in FIG. 8, a non-reciprocal circuit 300 having broadband isolation characteristics for a plurality of high frequency signals of mutually different frequency bands is provided (e.g., Patent Document 1). The non-reciprocal circuit 300 illustrated in FIG. 8 includes an isolator 130, a broadband circuit 4 that is connected in parallel to the isolator 130, and an output matching circuit 5 that is connected in series to the isolator 130 at a subsequent stage thereof. The isolator 130 includes a microwave ferrite 31 having a pair of principal surfaces located so as to be opposite to each other, and a first center electrode (inductor L1) and a second center electrode (inductor L2) are provided on the ferrite 31. The first center electrode is connected at one end to an input port of the ferrite 30 and connected at the other end to an output port of the ferrite 31, and the second center electrode is connected at one end to the output port and grounded at the other end in a state in which the second center electrode is isolated from the first center electrode on both principal surfaces. Then, a direct current magnetic field is applied to a portion where the first center electrode (inductor L1) and the second center electrode (inductor L2) intersect with each other through permanent magnets.

The broadband circuit 4 includes a capacitor C1 that is connected in parallel to the inductor L1 (first center electrode), and a series circuit that is connected in parallel to the inductor L1 and formed by a terminator R and an LC series resonant circuit (inductor L3 and capacitor C3). The output matching circuit 5 includes a capacitor CS2 that is connected in series to the output port of the isolator 130, and a capacitor C2 that is connected to the output port of the isolator 130 so as to be in parallel with the inductor L2. In addition, an input matching circuit 6 that includes a matching capacitor CS1 is connected to an input end of the non-reciprocal circuit 300.

In the non-reciprocal circuit 300 illustrated in FIG. 8, when a high frequency current is inputted to the input end through the input matching circuit 6, a large high frequency current flows through the second center electrode (inductor L2), whereas the high frequency current rarely flows through the first center electrode (inductor L1). Thus, an insertion loss is small, and the non-reciprocal circuit 300 operates in a broad band. At this point, the high frequency current rarely flows through the terminator R and the LC series resonant circuit (inductor L3 and capacitor C3), either. In the meantime, when a high frequency current is inputted to an output end of the non-reciprocal circuit 300, the high frequency current is matched in a broad band through the impedance characteristics of the terminator R and the LC series resonant circuit formed by the inductor L3 and the capacitor C3, and thus the isolation characteristics of the non-reciprocal circuit 300 improve. It is to be noted that the center frequency of the non-reciprocal circuit 300 is determined by a parallel resonant circuit that is formed by the capacitors C1 and C3 and the inductor L3 of the broadband circuit 4 and the inductor L1 (first center electrode).

Patent Document 1: Japanese Unexamined Patent Application Publication No. 2009-302742 (paragraphs 0014 to 0018, FIG. 1, Abstract, etc.)

BRIEF SUMMARY OF THE INVENTION

In a transmission module provided with the non-reciprocal circuit 300 illustrated in FIG. 8, which is configured for a broader band, an output of an amplifier circuit (power amplifier) is inputted to the non-reciprocal circuit 300. Then, in order to improve the efficiency of the amplifier circuit, an output impedance of the amplifier circuit and an input impedance of the non-reciprocal circuit 300 are matched through an interstage matching circuit that is provided between an output end of the amplifier circuit and the input end of the non-reciprocal circuit 300.

In Patent Document 1, the transmission band of the non-reciprocal circuit is broad, and thus, for example, an impedance curve (reflection coefficient S11) at the input end of the non-reciprocal circuit 300 on a Smith chart is long. Therefore, in a predetermined frequency band in which the amplifier circuit is used, the range of the input impedance of the non-reciprocal circuit 300 may not fit within, or may fall out of an impedance range that is desirable for the amplifier circuit. In addition, in a part of the frequency band in which the impedance curve at the input end of the non-reciprocal circuit 300 falls out of the stated impedance range, the output characteristics of the amplifier circuit deteriorate. Thus, when the impedance curve at the input end of the non-reciprocal circuit 300 is long, while the non-reciprocal circuit 300 has isolation characteristics in a broad band, it becomes difficult to match, in a broad band, the output impedance of the amplifier circuit and the input impedance of the non-reciprocal circuit 300 through the interstage matching circuit. Accordingly, it becomes difficult to broaden the transmission frequency of the transmission module 3 while maintaining the high efficiency of the amplifier circuit. However, a proper improvement has not been made on the aforementioned point.

The present invention has been made in view of the above problem, and the present invention is directed to providing a transmission module that is configured for a broader band while a degradation in the efficiency of a power amplifier is suppressed.

In order to achieve the above object, a transmission module according to the present invention includes an amplifier circuit, a non-reciprocal circuit, and an interstage matching circuit that is connected between an output end of the amplifier circuit and an input end of the non-reciprocal circuit. The non-reciprocal circuit includes an isolator provided with an input port and an output port, a broadband circuit disposed between the input port and the output port of the isolator and connected in parallel to the isolator, and an output matching circuit connected in series to the output port of the isolator. The isolator includes a microwave magnetic body, a first center electrode and a second center electrode disposed on the microwave magnetic body in a state in which the first center electrode and the second center electrode are isolated from each other while intersecting with each other, and permanent magnets configured to apply a direct current magnetic field to a portion where the first center electrode and the second center electrode intersect with each other. The first center electrode is connected at one end to an input end of the non-reciprocal circuit and connected at the other end to an input end of the output matching circuit. The second center electrode is connected at one end to the input end of the non-reciprocal circuit and grounded at the other end. The broadband circuit includes a first capacitor connected in parallel to the first center electrode, and a series circuit that is connected in parallel to the first center electrode and is formed by a terminator and an LC series resonant circuit. A second capacitor is connected in parallel to the non-reciprocal circuit.

In addition, a transmission module according to the present invention includes an amplifier circuit, a non-reciprocal circuit, and an interstage matching circuit that is connected between an output end of the amplifier circuit and an input end of the non-reciprocal circuit. The non-reciprocal circuit includes an isolator provided with an input port and an output port, a broadband circuit disposed between the input port and the output port of the isolator and connected in parallel to the isolator, and an output matching circuit connected in series to the output port of the isolator. The isolator includes a microwave magnetic body, a first center electrode and a second center electrode disposed on the microwave magnetic body in a state in which the first center electrode and the second center electrode are isolated from each other while intersecting with each other, and permanent magnets configured to apply a direct current magnetic field to a portion where the first center electrode and the second center electrode intersect with each other. The first center electrode is connected at one end to an input end of the non-reciprocal circuit and connected at the other end to an input end of the output matching circuit. The second center electrode is connected at one end to the input end of the output matching circuit and grounded at the other end. The broadband circuit includes a first capacitor connected in parallel to the first center electrode, and a series circuit that is connected in parallel to the first center electrode and is formed by a terminator and an LC series resonant circuit. A second capacitor is connected in parallel to the non-reciprocal circuit.

In addition, it is preferable that the first capacitor and the series circuit be connected in parallel.

According to the present invention configured as described above, as the second capacitor is connected in parallel to the non-reciprocal circuit outside the broadband circuit, which includes the first capacitor that is connected in parallel to the first center electrode of the isolator and the series circuit that is connected in parallel to the first center electrode of the isolator and is formed by the terminator and the LC series resonant circuit, in a predetermined frequency band in which the amplifier circuit is used, the input impedance of the non-reciprocal circuit is adjusted, and the length of the impedance curve (reflection coefficient S11) at the input end of the non-reciprocal circuit on a Smith chart can thus be reduced. Therefore, in a predetermined frequency band in which the amplifier circuit is used, the impedance curve at the input end of the non-reciprocal circuit can be made to fall within an impedance range that is desirable for the amplifier circuit (interstage matching circuit). In addition, an output impedance of the amplifier circuit and an input impedance of the non-reciprocal circuit can be matched in a broad band by the interstage matching circuit provided between the output end of the amplifier circuit and the input end of the non-reciprocal circuit. Consequently, a transmission module configured for a broader band while a degradation in the efficiency of the amplifier circuit is suppressed can be provided.

In addition, it is preferable that the output matching circuit be formed by a third capacitor that is connected at one end to the other end of the first center electrode and connected at the other end to an output end of the non-reciprocal circuit.

According to such a configuration, the output impedance of the non-reciprocal circuit can be adjusted with ease through the third capacitor connected in series to the isolator.

In addition, it is preferable that the output matching circuit further include a fourth capacitor that is connected at one end to one end of the third capacitor and grounded at the other end.

According to such a configuration, the output impedance of the non-reciprocal circuit can be adjusted with ease through the fourth capacitor connected in parallel to the isolator.

In addition, it is preferable that an input matching circuit be connected between the input end of the non-reciprocal circuit and an output end of the interstage matching circuit.

In this case, it is preferable that the input matching circuit be formed by a fifth capacitor that is connected at one end to the input end of the non-reciprocal circuit and connected at the other end to the output end of the interstage matching circuit.

According to such a configuration, the output impedance of the interstage matching circuit and the input impedance of the non-reciprocal circuit can be adjusted with ease through the fifth capacitor connected in series to the input end of the non-reciprocal circuit.

In addition, it is preferable that the input matching circuit further include a sixth capacitor that is connected at one end to the input end of the non-reciprocal circuit and grounded at the other end.

According to such a configuration, the output impedance of the interstage matching circuit and the input impedance of the non-reciprocal circuit can be adjusted with ease through the fourth capacitor connected in parallel to the input end of the non-reciprocal circuit.

According to the present invention, as the second capacitor is connected in parallel to the non-reciprocal circuit, in a predetermined frequency band in which the amplifier circuit is used, the length of the impedance curve (reflection coefficient S11) at the input end of the non-reciprocal circuit can be reduced. In addition, an output impedance of the amplifier circuit and an input impedance of the non-reciprocal circuit can be matched in a broad band through the interstage matching circuit provided between the output end of the amplifier circuit and the input end of the non-reciprocal circuit. Consequently, a transmission module that is configured for a broader band while a degradation in the efficiency of the amplifier circuit is suppressed can be provided.

BRIEF DESCRIPTION OF THE SEVERAL VIEWS OF THE DRAWINGS

FIGS. 3A and 3B illustrate Smith charts for describing the input impedance characteristics of non-reciprocal circuits, in which FIG. 3A illustrates the input impedance characteristics of a non-reciprocal circuit included in the transmission module illustrated in FIG. 1 and FIG. 3B illustrates the input impedance characteristics of an existing non-reciprocal circuit.

DETAILED DESCRIPTION OF THE INVENTION

<First Embodiment>

Figure 1:
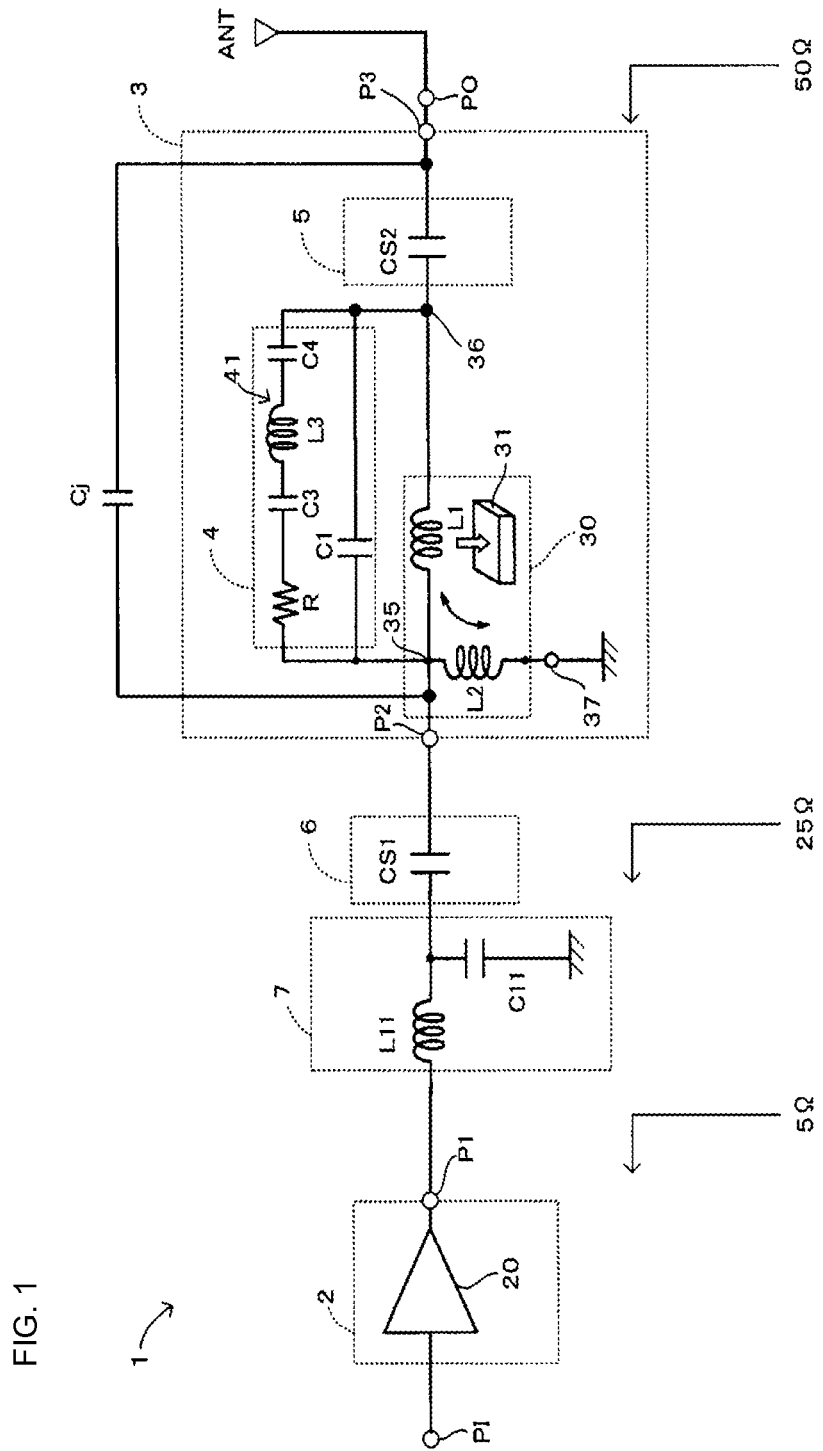
FIG. 1 is a circuit connection diagram illustrating a first embodiment of a transmission module according to the present invention.
Figure 2:
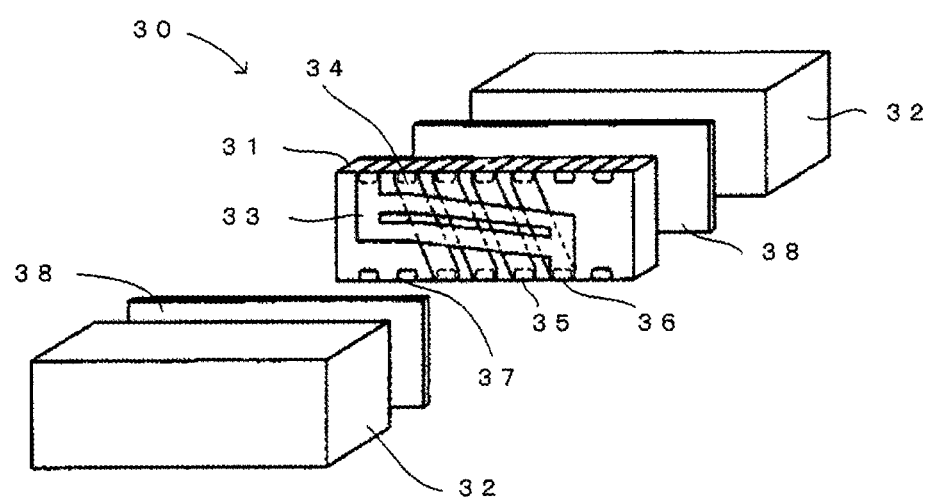
FIG. 2 is an exploded perspective view illustrating a ferrite-magnet element included in an isolator forming a non-reciprocal circuit.
Figure 3:
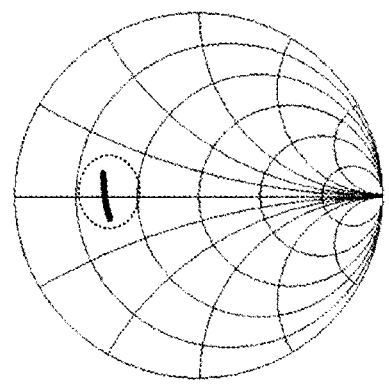
Figure 3:
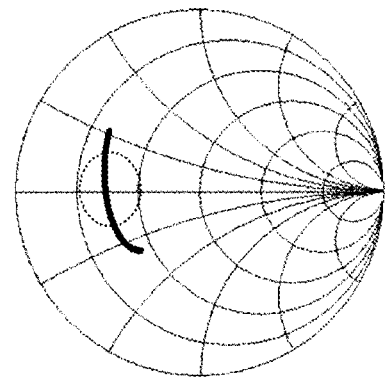
Figure 4:
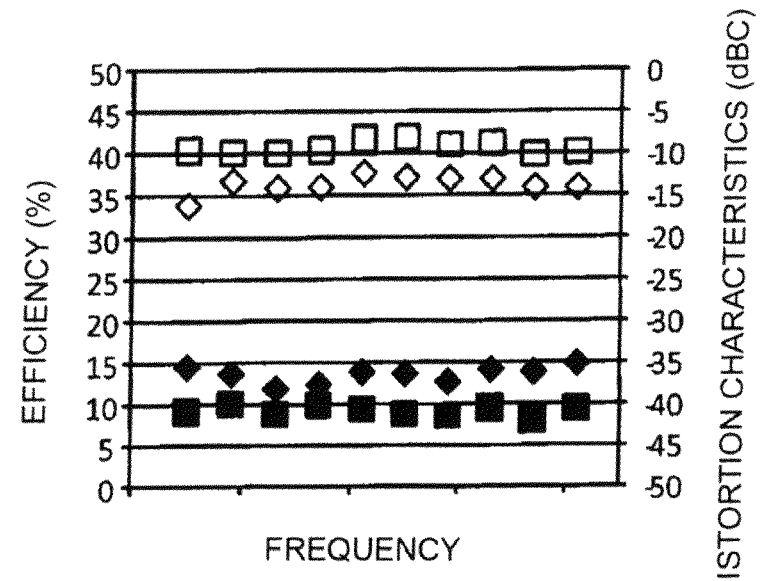
FIG. 4 illustrates the characteristics of a power amplifier included in the transmission module illustrated in FIG. 1.
Figure 8:
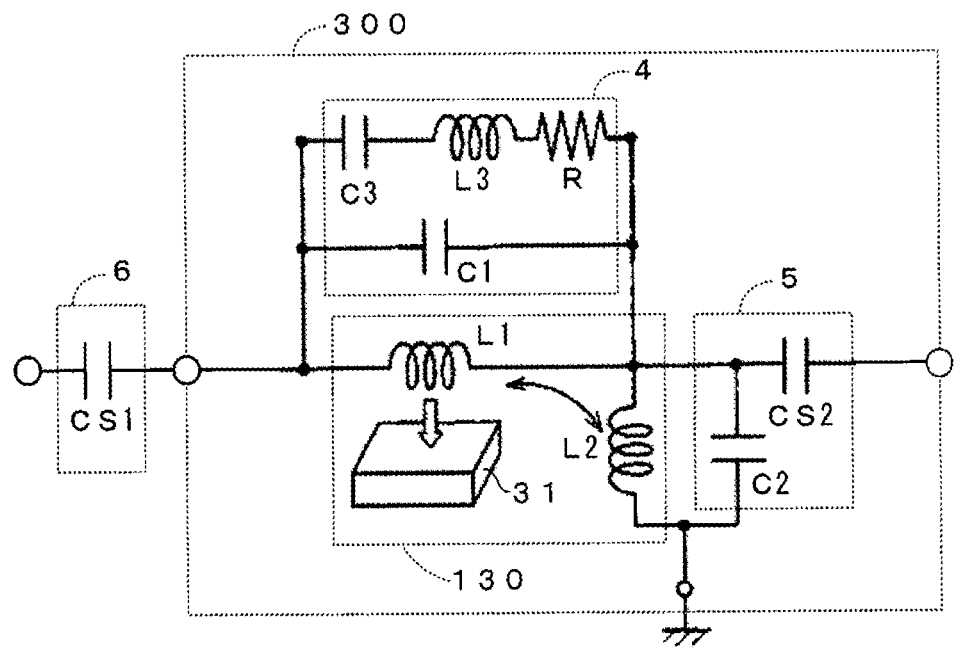
FIG. 8 illustrates a connection diagram of a non-reciprocal circuit provided in an existing transmission module.

A first embodiment of a transmission module according to the present invention will be described with reference to FIG. 1 through FIG. 4. FIG. 1 is a circuit connection diagram illustrating the first embodiment of a transmission module according to the present invention. FIG. 2 is an exploded perspective view illustrating a ferrite-magnet element included in an isolator forming a non-reciprocal circuit. FIG. 3 illustrates Smith charts for describing the input impedance characteristics of non-reciprocal circuits, in which (a) illustrates the input impedance characteristics of a non-reciprocal circuit included in the transmission module illustrated in FIG. 1 and (b) illustrates the input impedance characteristics of an existing non-reciprocal circuit. FIG. 4 illustrates the characteristics of a power amplifier included in the transmission module illustrated in FIG. 1. It is to be noted that configurations that are similar to the configurations of the non-reciprocal circuit provided in an existing transmission module as illustrated in FIG. 8 are given identical reference characters.

A transmission module 1 illustrated in FIG. 1 is an electric power amplifier module that is formed by disposing a power amplifier 2 (corresponding to an "amplifier circuit" according to the present invention), a non-reciprocal circuit 3, an interstage matching circuit 7, an input matching circuit 6, and so forth on a board formed of resin, ceramics, or the like. The power amplifier 2 amplifies a transmission signal (high frequency signal) inputted through an input terminal PI. The non-reciprocal circuit 3 includes an isolator 30 having characteristics of transmitting a signal only in a specific direction determined in advance. The interstage matching circuit 7 and the input matching circuit 6 are provided between an output terminal P1 of the amplifier circuit 2 and an input terminal P2 of the non-reciprocal circuit 3. Such a transmission module 1 is used in a transmission circuit section of a portable communication terminal (communication system), such as a cellular phone and a portable information terminal. A transmission signal that has been inputted through the input terminal PI is amplified in the transmission module 1 and is outputted through an output terminal PO, and the resulting transmission signal is then outputted to an antenna element ANT through a branch circuit, such as a duplexer (not illustrated).

Specifically, the transmission module 1 configured for multiband or multimode transmission is used in communication that uses a first transmission frequency band covering, for example, W-CDMA system band 1 (1920 MHz to 1980 MHz), band 2 (1850 MHz to 1910 MHz), band 3 (1710 MHz to 1785 MHz), GSM (registered trademark) (Global System for Mobile Communications) 1800 system (1710 MHz to 1785 MHz), and GSM 1900 system (1850 MHz to 1910 MHz), or covering LTE (Long Term Evolution) system and W-CDMA system band 1 (1920 MHz to 1980 MHz), band 2 (1850 MHz to 1910 MHz), and band 3 (1710 MHz to 1785 MHz). The transmission module 1 is also used in communication that uses a second transmission frequency band covering, for example, W-CDMA system band 5 (824 MHz to 849 MHz), band 8 (880 MHz to 915 MHz), GSM 800 system (806 MHz to 821 MHz, 824 MHz to 849 MHz), and GSM 900 system (870.4 MHz to 915 MHz). Here, a transmission module that is compatible with both the first transmission frequency band and the second transmission frequency band may be formed by integrating a transmission module 1 for communication using the first transmission frequency band and a transmission module 1 for communication using the second transmission frequency band that are provided alongside with each other.

The power amplifier 2 includes, for example, an NPN transistor serving as an amplifier element 20 formed by a GaAsHBT (heterojunction bipolar transistor) that forms a grounded emitter circuit. The amplifier element 20 is disposed at an output stage of the power amplifier 2 and amplifies a transmission signal inputted through the input terminal PI. In FIG. 1, only the amplifier element 20 disposed at the output stage of the power amplifier 2 is illustrated, and other amplifier elements forming the power amplifier 2, an interstage matching circuit disposed between amplifier elements, and so forth are omitted from the drawing for the sake of simplicity. Here, instead of a heterojunction bipolar transistor, a field effect transistor of which source is grounded may be used as an amplifier element.

As illustrated in FIG. 1, an output impedance of the power amplifier 2 is set to approximately 5 Ω in this embodiment.

The non-reciprocal circuit 3 includes the isolator 30, a broadband circuit 4 that is connected in parallel to the isolator 30, and an output matching circuit 5 that is connected in series to the isolator 30 at a subsequent stage thereof. As illustrated in FIG. 2, the isolator 30 includes a microwave ferrite 31 (corresponding to a "magnetic body" according to the present invention) and a pair of permanent magnets 32, and the ferrite 31 includes a pair of principal surfaces that are located opposite to each other. The ferrite 31 is disposed between one magnetic pole of one of the permanent magnets 32 and an opposite magnetic pole of the other permanent magnet 32. Specifically, each of the ferrite 31 and the permanent magnets 32 has a rectangular parallelepiped shape, and the ferrite 31 and the permanent magnets 32 are joined, for example, by epoxy-based adhesives 38 in such a manner that a direct current magnetic field is applied to the principal surfaces of the ferrite 31 in a direction substantially perpendicular to the principal surfaces by the permanent magnets 32.

In addition, an input port 35, an output port 36, and a ground port 37 are provided on one of the side surfaces that are orthogonal to the principal surfaces of the ferrite 31. A first center electrode 33 (inductor L1) and a second center electrode (inductor L2) are provided on the ferrite 31. The first center electrode 33 is connected at one end to the input port 35 and connected at the other end to the output port 36. The second center electrode 34 is connected at one end to the input port 35 and connected at the other end to the ground port 37 in a state in which the second center electrode 34 is isolated from the first center electrode 33 on the principal surfaces. Then, a direct current magnetic field is applied to a portion where the first center electrode 33 and the second center electrode 34 intersect with each other by the permanent magnets 32.

The first center electrode 33 is formed on the ferrite 31 by a conductive film. The first center electrode 33 rises from the output port 36 located at a lower right side of one of the principal surfaces and extends obliquely at a relatively small angle toward an upper left side in a state in which the first center electrode 33 is branched into two. Then, the first center electrode 33 reaches the upper left side and extends onto the other principal surface through a relay electrode provided on the upper end surface. The first center electrode 33 is further formed on the other principal surface so as to extend from the upper left side toward the lower right side in such a manner that the first center electrode 33 substantially overlaps the first center electrode 33 formed on the one principal surface when seen from the side of the one principal surface, and is connected to the output input port 35.

Meanwhile, the second center electrode 34 is formed on the ferrite 31 by a conductive film in a state in which the second center electrode 34 is isolated from the first center electrode 33 on the principal surfaces of the ferrite 31. The second center electrode 34 is formed so as to be wound around the ferrite 31 while intersecting with the first center electrode 33 in a state in which the second center electrode 34 is at a relatively large angle relative to the long side of the ferrite 31, and is connected to the ground port 37.

The ferrite 31 can be formed, for example, of YIG ferrite, and the first and second center electrodes 33 and 34 and the ports 35 through 37 can each be formed as a thick film or a thin film of silver or a silver alloy through such a fabrication method as printing, transfer, and photolithography. In addition, an insulator film for providing insulation between the first and second center electrodes 33 and 34 can be formed through such a fabrication method as printing, transfer, and photolithography with the use of a dielectric thick film of glass, alumina, or the like or a resin film of polyimide or the like.

It is to be noted that the ferrite 31 can be fired integrally from a magnetic material to include an insulator film and various electrodes, and in such a case, the electrodes may be formed of Pd, Ag, or an alloy thereof so as to withstand high temperature firing.

In addition, as a material for the permanent magnets 32, any material may be employed, such as a strontium-based ferrite magnet that excels in magnetic characteristics, such as residual magnetic flux density and magnetic coercive force, and that excels in insulation properties and low loss properties in a high frequency band, or a lanthanum-cobalt-based ferrite magnet that excels in magnetic characteristics, such as residual magnetic flux density and magnetic coercive force, that is suitable for reducing the size of the permanent magnet 32, and that can be used even with the insulation properties in a high frequency band taken into consideration.

The broadband circuit 4 includes a capacitor C1 (first capacitor) that is connected in parallel to the first center electrode 33 (inductor L1) and a series circuit that is connected in parallel to the first center electrode 33 and is formed by a terminator R and an LC series resonant circuit 41 formed by an inductor L3 and capacitors C3 and C4. The output matching circuit 5 that is connected in series to the output port 36 of the isolator 30 includes an impedance adjusting capacitor CS2 (third capacitor) that is connected at one end to the other end (output port 36) of the first center electrode 33 and connected at the other end to an output terminal P3 of the non-reciprocal circuit 3.

In addition, a capacitor Cj (second capacitor) for adjusting the band of an input impedance of the non-reciprocal circuit 3 is disposed outside the broadband circuit 4 and is connected in parallel to the non-reciprocal circuit 3. Although the LC series resonant circuit 41 in this embodiment is formed by connecting, in series, the inductor L3 and the two capacitors C3 and C4 sandwiching the inductor L3, the LC series resonant circuit 41 may be formed by a circuit configuration in which an inductor and a capacitor are simply connected in series or by a circuit configuration in which a capacitor is sandwiched by two inductors.

The input matching circuit 6 is connected to the input terminal P2 of the non-reciprocal circuit 3. The input matching circuit 6 includes an impedance adjusting capacitor CS1 (fifth capacitor) that is connected at one end to an output end of the interstage matching circuit 7 and connected at the other end to the input terminal P2 of the non-reciprocal circuit 3.

In the non-reciprocal circuit 3 configured as described above, an inductance of the inductor L2 (second center electrode 34) is set higher than an inductance of the inductor L1 (first center electrode 33). Thus, when a high frequency signal is inputted through the input terminal P2 of the non-reciprocal circuit 3, a current rarely flows through the inductor L2 or the terminator R, but a current flows through the inductor L1, and the inputted high frequency signal is thus outputted to the output terminal P3 of the non-reciprocal circuit 3. In addition, when a high frequency signal is inputted through the output terminal P3 of the non-reciprocal circuit 3 in a reverse direction, a current is attenuated (isolated) by a parallel resonant circuit formed by the inductor L1 and the capacitor C1 and by the terminator R.

Here, as the inductance of the inductor L2 is set higher than the inductance of the inductor L1, in this embodiment, as illustrated in FIG. 1, the real part of the input impedance of the input matching circuit 6, which is connected to the input terminal P2 of the non-reciprocal circuit 3, decreases to approximately 25 Ω. Thus, as compared to the configuration of an existing non-reciprocal circuit in which the real parts of the input/output impedances are both set to 50 Ω, the magnitude of the real part of the input impedance can be reduced to approximately half of that of the existing configuration.

It is to be noted that as a condition in which the first and second center electrodes 33 and 34 are wound around the ferrite 31, such as an angle at which the first and second center electrodes 33 and 34 intersect with each other, is adjusted as appropriate, electrical characteristics, such as an input impedance and an insertion loss, of the non-reciprocal circuit 3 are adjusted. In other words, as the inductance ratio (L2/L1: the ratio of the number of turns of the first and second center electrodes 33 and 34 on the ferrite 31) increases, a conversion amount of the impedance from the input impedance to the output impedance in the non-reciprocal circuit 3 increases both in the real part and in the imaginary part. Thus, the conversion amount of the impedance can be adjusted by setting the number of turns of the first and second center electrodes 33 and 34 as appropriate. It is to be noted that the imaginary part of the impedance is set to be adjusted from a given value to 0 Ω by the impedance adjusting capacitors CS1 and CS2.

In addition, the LC series resonant circuit 41, which is connected in series to the terminator R, is connected in parallel to the inductor L1 (first center electrode 33) between the input port 35 and the output port 36 of the isolator 30. Thus, when a high frequency signal is inputted to the output terminal P3 of the non-reciprocal circuit 3 in a reverse direction, the high frequency signal is matched in a broad band through the impedance characteristics of the terminator R and the LC series resonant circuit 41. Therefore, the isolation characteristics of the non-reciprocal circuit 3 improve over a broad frequency band, and an insertion loss of the non-reciprocal circuit 3 of the transmission module can be reduced.

Specifically, in a case in which the transmission module 1 is used in communication that uses a transmission frequency band (824 MHz to 915 MHz) of W-CDMA system bands 5 and 8, for example, the band is broadened such that the isolation characteristics of approximately −10 dB can be secured when a high frequency signal is inputted through the output terminal P3 of the non-reciprocal circuit 3. In addition, the insertion loss of the non-reciprocal circuit 3 is limited to the maximum of approximately −0.64 dB within a frequency band used in communication, or in other words, within a frequency band in which a signal is amplified by the power amplifier 2.

As illustrated in FIG. 1, the interstage matching circuit 7 is formed as a single stage low pass filter by an inductor L11 and a capacitor C11. In this embodiment, as illustrated in FIG. 1, the output impedance of 5 Ω of the power amplifier 2 is converted to the input impedance of 25 Ω of the non-reciprocal circuit 3 (input matching circuit 6) by the interstage matching circuit 7.

Subsequently, an effect obtained by connecting the capacitor Cj in parallel to the non-reciprocal circuit 3 will be described.

As seen from the Smith chart illustrated in FIG. 3(a), as the capacitor Cj is connected in parallel to the non-reciprocal circuit 3, in a frequency band used in communication, or in other words, in a frequency band in which a signal is amplified by the power amplifier 2, the input impedance of the non-reciprocal circuit 3 is adjusted and the length of the impedance curve (reflection coefficient S11) at the input terminal P2 of the non-reciprocal circuit 3 can thus be reduced. In other words, the amount of change in the impedance at the input terminal P2 of the non-reciprocal circuit 3 can be reduced in a frequency band used in communication. In the meantime, if the capacitor Cj is not connected in parallel to the non-reciprocal circuit 3, as illustrated in FIG. 3B, in a frequency band used in communication, or in other words, in a frequency band in which a signal is amplified by the power amplifier 2, the length of the impedance curve at the input terminal P2 of the non-reciprocal circuit 3 increases.

Thus, as the capacitor Cj is connected in parallel to the non-reciprocal circuit 3, in a predetermined frequency band in which the power amplifier 2 is used, the impedance curve at the input terminal P2 of the non-reciprocal circuit 3 can be made to fall within an impedance range (25 Ω and the vicinity thereof) that is desirable for the power amplifier 2 (interstage matching circuit 7), as indicated by dotted enclosures in FIGS. 3A and 3B. In addition, the output impedance of the power amplifier 2 and the input impedance of the non-reciprocal circuit 3 can be matched in a broad band by the interstage matching circuit 7 and the input matching circuit 6 provided between the output terminal P1 of the power amplifier 2 and the input terminal P2 of the non-reciprocal circuit 3.

Here, the impedance range that is desirable for the power amplifier 2 corresponds to an impedance range in which the power amplifier 2 can amplify a predetermined output, and by matching the input impedance of the non-reciprocal circuit 3 to the stated range, an amplification signal from the power amplifier 2 can be amplified efficiently in a broad band.

In addition, as illustrated in FIG. 4, for example, in the aforementioned first transmission frequency band, when a case in which the capacitor Cj is connected in parallel to the non-reciprocal circuit 3 (indicated by □ in FIG. 4) is compared with a case in which the capacitor Cj is not connected in parallel to the non-reciprocal circuit 3 (indicated by ◇ in FIG. 4), it can be seen that the efficiency of the power amplifier 2 improves in a broad band. In addition, as illustrated in FIG. 4, for example, in the aforementioned first transmission frequency band, when a case in which the capacitor Cj is connected in parallel to the non-reciprocal circuit 3 (indicated in FIG. 4) is compared with a case in which the capacitor Cj is not connected in parallel to the non-reciprocal circuit 3 (indicated by ♦ in FIG. 4), the distortion characteristics of the power amplifier 2 are improved across a broad band that is used in communication. It is to be noted that similar effects can be obtained in the aforementioned second transmission frequency band as well.

As described thus far, according to the embodiment described above, the capacitor Cj is connected in parallel to the non-reciprocal circuit 3 outside the broadband circuit 4, which includes the capacitor C1 that is connected in parallel to the first center electrode 33 of the isolator 30 and the series circuit that is connected in parallel to the first center electrode 33 of the isolator 30 and is formed by the terminator R and the LC series resonant circuit 41. Thus, in a predetermined frequency band in which the power amplifier 2 is used, or in other words, in a predetermined frequency band used in communication, the input impedance of the non-reciprocal circuit 3 is adjusted, and the length of the impedance curve (reflection coefficient S11) at the input terminal P2 of the non-reciprocal circuit 3 can thus be reduced. Therefore, in a predetermined frequency band in which the power amplifier 2 is used, the impedance curve at the input terminal P2 of the non-reciprocal circuit 3 can be made to fall within an impedance range that is desirable for the power amplifier 2 (interstage matching circuit 7). In addition, the output impedance of the power amplifier 2 and the input impedance of the non-reciprocal circuit 3 can be matched in a broad band through the interstage matching circuit 7 and the input matching circuit 6 provided between the output terminal P1 of the power amplifier 2 and the input terminal P2 of the non-reciprocal circuit 3. Accordingly, the transmission module 1 configured for a broader band while a degradation in the efficiency of the power amplifier 2 is suppressed can be provided.

The output impedance of the non-reciprocal circuit 3 can be adjusted with ease through the capacitor CS2 provided in the output matching circuit 5 that is connected in series to the isolator 30.

The input impedance of the non-reciprocal circuit 3 is reduced as compared to that of the existing technique, and thus the impedance conversion ratio from the output terminal P1 of the power amplifier 2 to the input terminal P2 of the non-reciprocal circuit 3 can be made relatively small. Therefore, the configuration of the interstage matching circuit 7 can be simplified. Through this, the insertion loss of the interstage matching circuit 7 is reduced, and the efficiency of the transmission module 1 can be increased. In addition, since the interstage matching circuit 7 can be simplified, the cost of fabricating the transmission module 1 can be reduced. Furthermore, since the interstage matching circuit 7 can be simplified, the interstage matching circuit 7 of a single stage low pass filter type having a simple and practical configuration can be formed by the inductor L11 and the capacitor C11.

When the output impedance of the power amplifier 2 is to be converted to the preset output impedance (e.g., 50 Ω) of the non-reciprocal circuit 3, the impedance can be converted in two stages by changing the configuration of the interstage matching circuit 7 and the configuration of each passive element or the isolator 30 included in the non-reciprocal circuit 3, and thus the degree of freedom in designing the transmission module 1 can be enhanced.

Since the interstage matching circuit 7 can be simplified, even though the non-reciprocal circuit 3 is provided, the transmission module 1 can be configured to have an insertion loss that is equivalent to the insertion loss of a transmission module that does not include the non-reciprocal circuit 3. Thus, as the non-reciprocal circuit 3 is provided, the transmission module 1 that has greater tolerance to a load change than an existing technique and that has an insertion loss that is equivalent to or lower than the insertion loss in an existing technique can be provided.

In the transmission module 1, the transmission signals in a plurality of frequency bands or in mutually different communication systems can be amplified efficiently at a low loss. Therefore, the transmission module 1 does not need to be provided for each of the frequency bands or for each of the different communication systems, and the transmission signals of the respective frequency bands can be amplified and transmitted by the common transmission module 1. Consequently, such a configuration provides greater efficiency, and the configuration of the components provided in an apparatus in which the transmission module 1 is mounted can be simplified.

Specifically, as described above, the transmission module 1, which excels in loss characteristics and isolation characteristics in a broad band, can be used suitably in a communication system that is compatible with multiband and multimode transmission, and examples of such a communication system include a communication system that carries out wireless communication compatible with each of W-CDMA system bands 1, 2, and 3, GSM 1800 system, and GSM 1900 system; a communication system that carries out wireless communication compatible with each of W-CDMA system bands 5 and 8, GSM 800 system, and GSM 900 system; and a communication system that carries out wireless communication compatible with each of W-CDMA system bands 1, 2, and 3 and LTE system bands 1, 2, and 3.

<Second Embodiment>

Figure 5:
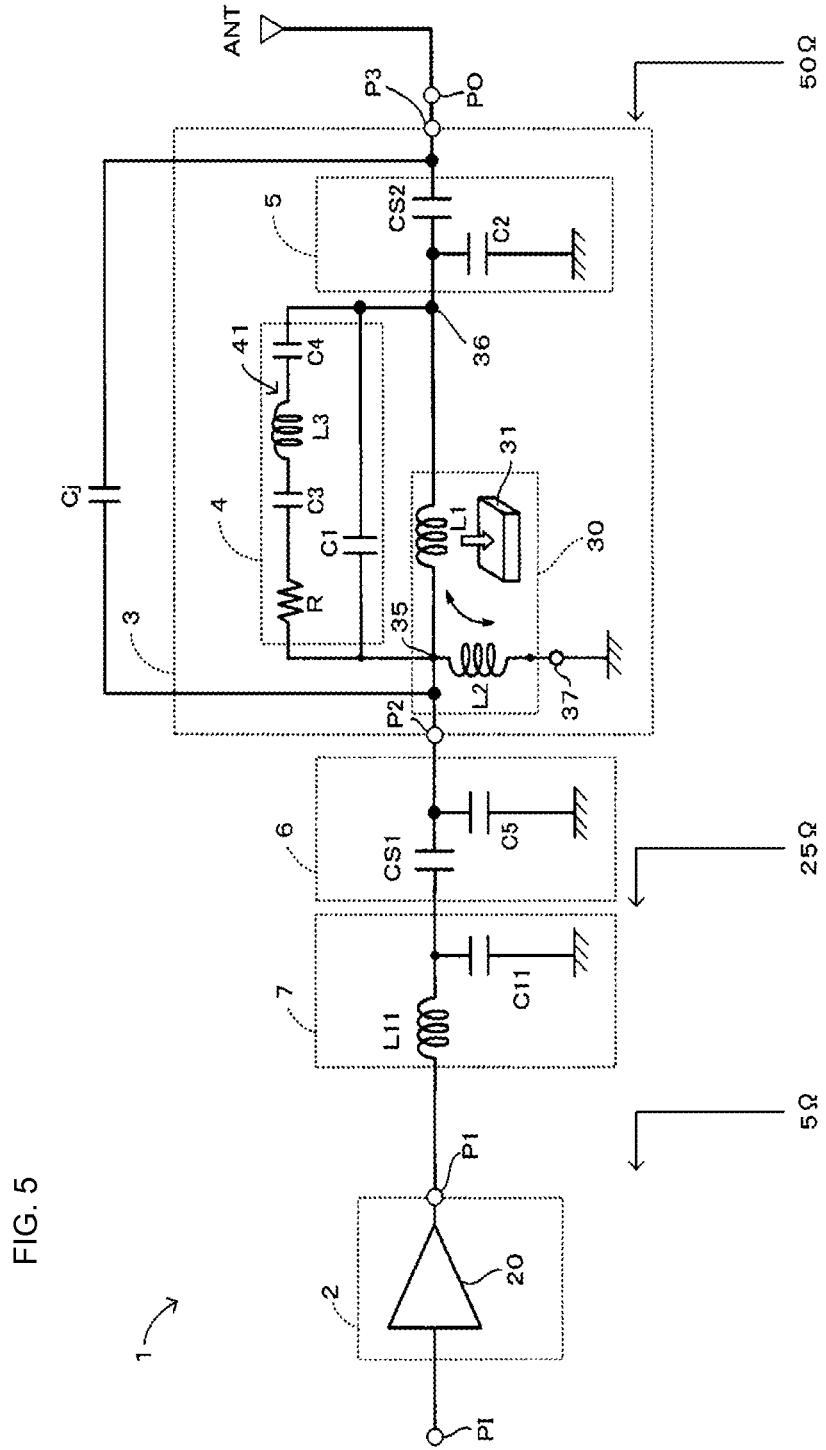
FIG. 5 is a circuit connection diagram illustrating a second embodiment of a transmission module according to the present invention.

A second embodiment of a transmission module according to the present invention will be described with reference to FIG. 5. FIG. 5 is a circuit connection diagram illustrating the second embodiment of a transmission module according to the present invention. This embodiment differs from the first embodiment described above in that, as illustrated in FIG. 5, the output matching circuit 5 further includes a capacitor C2 (fourth capacitor) and in that the input matching circuit 6 includes a capacitor C5 (sixth capacitor). The capacitor C2 is connected at one end to one end (output port 36) of the capacitor CS2 and grounded at the other end. The capacitor C5 is connected at one end to the input terminal P2 of the non-reciprocal circuit 3 and grounded at the other end. Other configurations are similar to those of the first embodiment described above. Thus, similar configurations are given identical reference characters, and the descriptions of such configurations and operations will be omitted.

Through such a configuration, effects similar to those of the first embodiment described above can be obtained, and the following effect can additionally be obtained. Specifically, the range in which the output impedance is adjusted can be broadened by the capacitor C2 that is connected in parallel to the isolator 30.

<Third Embodiment>

Figure 6:
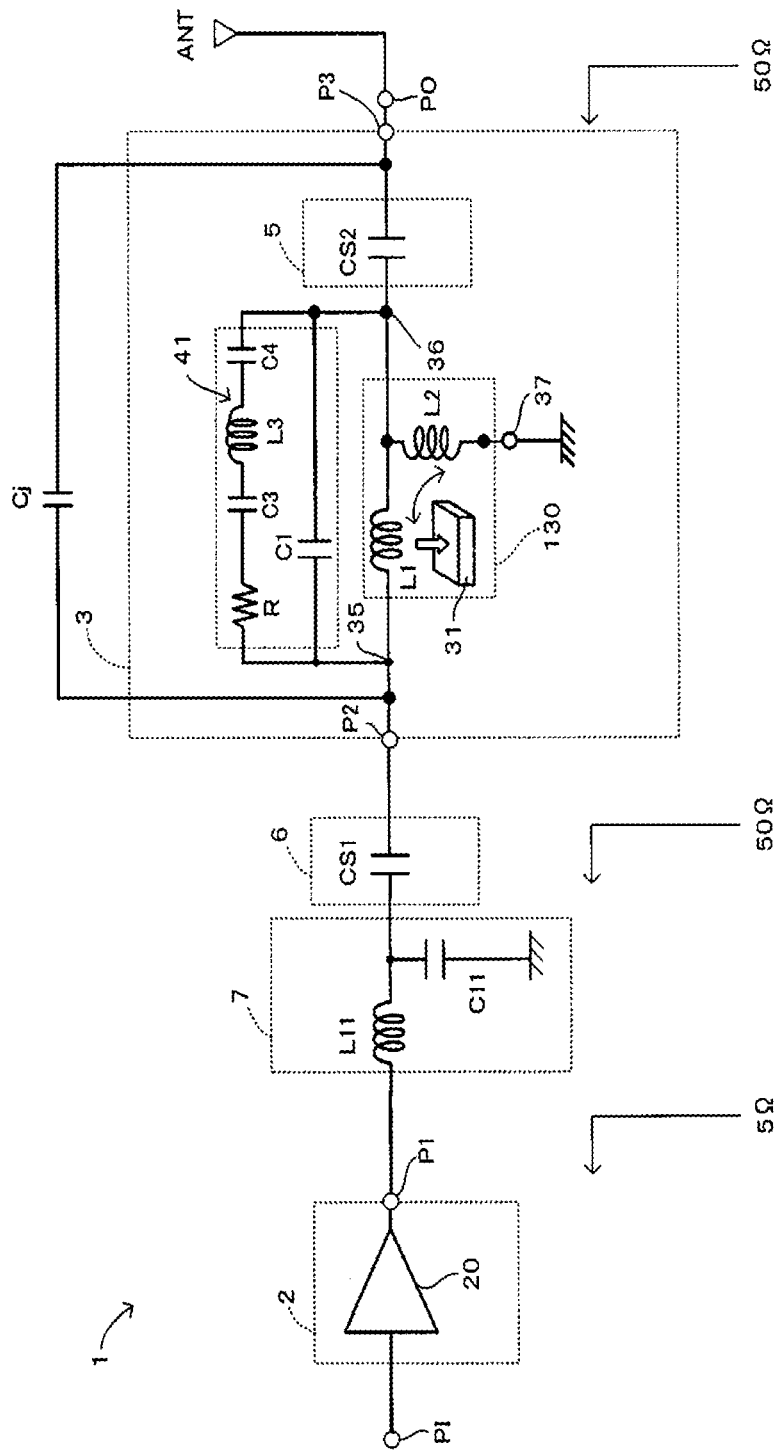
FIG. 6 is a circuit connection diagram illustrating a third embodiment of a transmission module according to the present invention.

A third embodiment of a transmission module according to the present invention will be described with reference to FIG. 6. FIG. 6 is a circuit connection diagram illustrating the third embodiment of a transmission module according to the present invention. This embodiment differs from the first embodiment described above in that, as illustrated in FIG. 6, an isolator 130 has a configuration similar to that of the exiting isolator illustrated in FIG. 8. Specifically, the first center electrode 33 (inductor L1) is connected at one end to the input port 35 and connected at the other end to the output port 36, and the second center electrode 34 (inductor L2) is connected at one end to the output port 36 and connected at the other end to the ground port 37. Other configurations are similar to those of the first embodiment described above. Thus, similar configurations are given identical reference characters, and the descriptions of such configurations and operations will be omitted.

Through such a configuration, effects similar to those of the first embodiment described above can be obtained. It is to be noted that the input impedance of the input matching circuit 6 that is connected to the input terminal P2 of the non-reciprocal circuit 3 is set to approximately 50 Ω in this embodiment.

<Fourth Embodiment>

Figure 7:
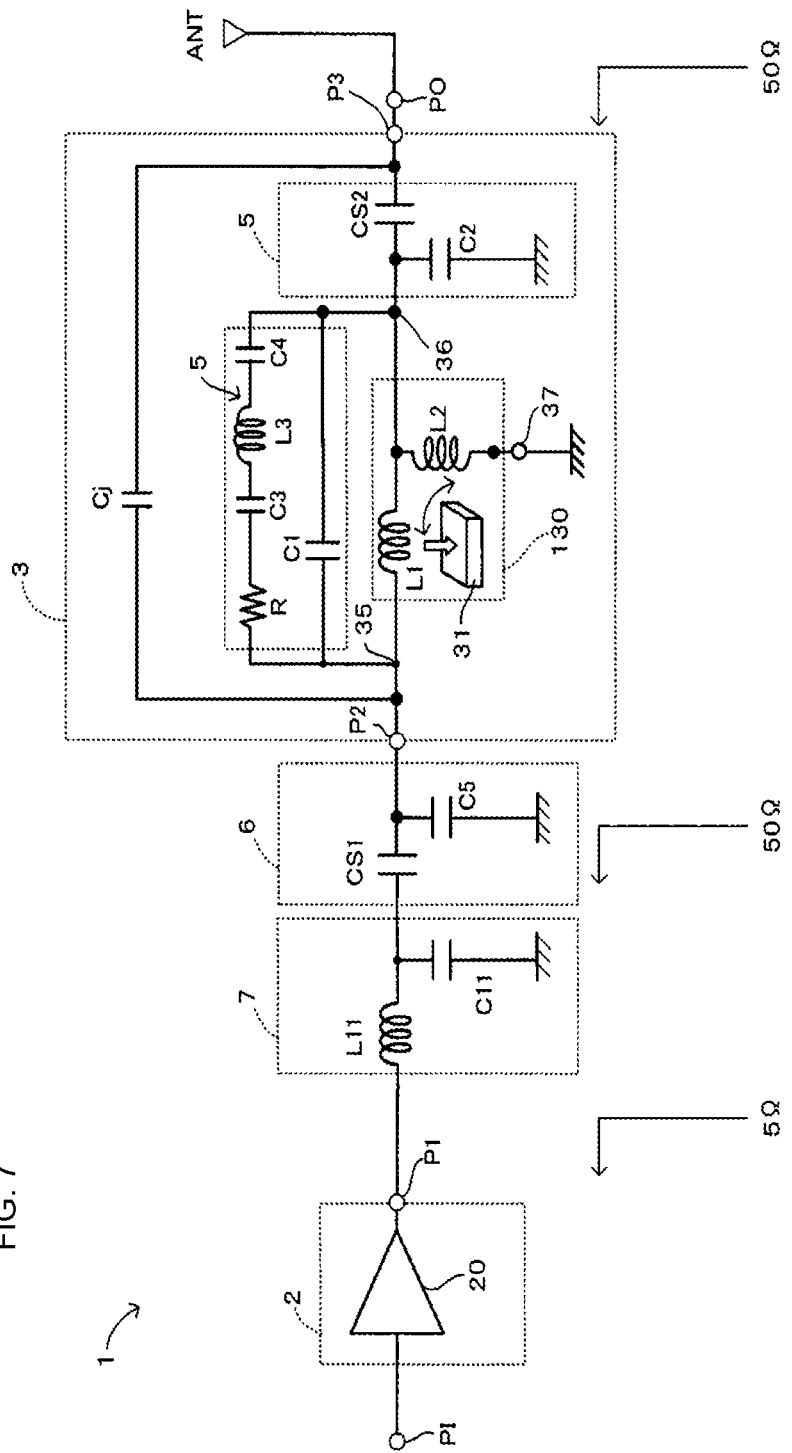
FIG. 7 is a circuit connection diagram illustrating a fourth embodiment of a transmission module according to the present invention.

A fourth embodiment of a transmission module according to the present invention will be described with reference to FIG. 7. FIG. 7 is a circuit connection diagram illustrating the fourth embodiment of a transmission module according to the present invention. This embodiment differs from the second embodiment described above in that, as illustrated in FIG. 7, the isolator 130 has a configuration similar to that of the exiting isolator illustrated in FIG. 8. Specifically, the first center electrode 33 (inductor L1) is connected at one end to the input port 35 and connected at the other end to the output port 36, and the second center electrode 34 (inductor L2) is connected at one end to the output port 36 and connected at the other end to the ground port 37. Other configurations are similar to those of the first and second embodiments described above. Thus, similar configurations are given identical reference characters, and the descriptions of such configurations and operations will be omitted.

Through such a configuration, effects similar to those of the first and second embodiments described above can be obtained. It is to be noted that the input impedance of the input matching circuit 6 that is connected to the input terminal P2 of the non-reciprocal circuit 3 is set to approximately 50 Ω in this embodiment.

It is to be noted that the present invention is not limited to the embodiments described above, and various modifications can be made, aside from those described above, without departing from the spirit of the present invention. For example, all of the characteristics of the transmission module 1 described above are merely examples, and the configurations of the power amplifier 2, the non-reciprocal circuit 3, and the matching circuit 4 may be designed as appropriate in manners described above in accordance with the configurations of a wireless communication apparatus or a wireless communication terminal in which the transmission module 1 is to be mounted or in accordance with a used frequency band.

The configurations of the isolators 30 and 130 are not limited to the examples described above. For example, the center electrodes may be formed on the pair of permanent magnets 32 at the respective surfaces that are opposed to the principal surfaces of the ferrite 31, and the center electrodes formed on the permanent magnets 32 may be electrically connected to each other through relay electrodes formed on an upper end surface and a lower end surface of the ferrite 31 in a state in which the pair of permanent magnets 32 and the ferrite 31 are joined.

In addition, the electronic components to be disposed on the board included in the transmission module 1 are not limited to the examples described above, and any suitable electronic components may be selected and mounted on the board, as appropriate, in accordance with the intended use or the design of the transmission module 1. For example, an interstage filter (SAW filter) or an electric power detector may further be mounted in the transmission module 1, or a switch, a multiplexer, such as a diplexer, a coupler, or the like may further be mounted. In addition, the passive elements, such as the inductors L3 and L11, the capacitors C1 through C5, C11, and Cj, and the terminator R, may each be constituted by a chip component mounted on the board. Alternatively, instead of a chip component, the passive elements may each be constituted by a component embedded in the board or formed by a wiring pattern on the board. In addition, the transistor of the amplifier element 20 may be formed by a known amplifier element, such as an FET, instead of the GaAsHBT described above.

Although the interstage matching circuit 7 is formed as a single stage low pass filter in each of the embodiments described above, the interstage matching circuit 7 may take any configuration, such as a low pass filter of two stages or three or more stages and a high pass filter, and the interstage matching circuit 7 may be formed through a known circuit configuration as necessary.

Here, as illustrated in FIG. 1 and FIG. 5 through FIG. 7, typically, the output impedance of the transmission module 1 is designed on the assumption that a device having an input impedance of 50 Ω is connected to the transmission module 1. However, a VSWR (Voltage Standing Wave Ratio) changes due to a change in a load of the antenna element ANT or the like. Thus, since the VSWR changes in keeping with a change in the load of the antenna element ANT or the like, a collector current in the transistor of the amplifier element 20 in the power amplifier 2 increases, and the power amplifier 2 may be damaged. In order to prevent such a phenomenon, the permissible range of the emitter size of the transistor is set to a size that is sufficiently large relative to the increase in the collector current arising in keeping with the change in the VSWR.

For example, in a case in which the non-reciprocal circuit 3 is not provided, the emitter size of the transistor of the amplifier element 20 at the output stage of the power amplifier 2 of the transmission module 1 is set such that the collector current value held when the VSWR has changed to a value that is ten times greater than an anticipated maximum value falls within the permissible range. Specifically, in a case in which the maximum value of the output current (collector current) of the power amplifier 2 is approximately 1.3 A while there is no change in the load of the antenna element ANT or the like and the output impedance is stable at 50 Ω, if, for example, the VSWR changes tenfold in keeping with a change in the load of the antenna element ANT or the like, the maximum value of the output current of the power amplifier 2 increases approximately twofold to approximately 2.6 A. Thus, the emitter size of the transistor of the amplifier element 20 at the output stage of the power amplifier 2 is set to such a size that the collector current of approximately 2.6 A falls within the permissible range.

However, in the transmission module 1 illustrated in FIG. 1 and FIG. 5 through FIG. 7, an output signal of the power amplifier 2 is outputted to the antenna element ANT through the non-reciprocal circuit 3. Thus, even if the VSWR observed at the output terminal PO of the transmission module 1 changes in keeping with a change in the load of the antenna element ANT or the like, a change in the load as seen from the output terminal P1 of the power amplifier 2 is suppressed. Specifically, for example, in a case in which the non-reciprocal circuit 3 has isolation characteristics of −15 dB, even if the VSWR observed at the output terminal PO of the transmission module 1 changes tenfold in keeping with a change in the load of the antenna element ANT or the like, the maximum value of the output current (collector current) of the power amplifier 2 is regulated to approximately 1.5 A.

Thus, the emitter size of the transistor of the amplifier element 20 at the output stage of the power amplifier 2 may be set such that the maximum value (e.g., 1.5 A) reached when the output current of the power amplifier 2 changes due to a change in the load of the antenna element ANT or the like, which is also determined in advance on the basis of the isolation characteristics of the non-reciprocal circuit 3, falls within a predefined permissible range. Through such a configuration, as described above, in a case in which the maximum value of the output current (collector current) of the power amplifier 2 held in keeping with a change in the VSWR is regulated from approximately 2.6 A to approximately 1.5 A by the non-reciprocal circuit 3, the emitter size of the transistor of the amplifier element 20 can be reduced by approximately 40%. In addition, as the emitter size of the transistor of the amplifier element 20 is set to be smaller than that of an existing technique in this manner, the output impedance of the power amplifier 2, which is approximately 5 Ω in an existing technique, can be increased, for example, to approximately 6.5 Ω.

In this manner, while the change in the load of the power amplifier 2 is determined in advance on the basis of the isolation characteristics of the non-reciprocal circuit 3, the maximum value reached when the output current of the power amplifier 2 changes due to the aforementioned change in the load is extremely smaller than that of a case in which the non-reciprocal circuit 3 is not provided in the transmission module 1. Thus, as the emitter size of the transistor of the amplifier element 20 at the output stage of the power amplifier 2 is set such that the maximum value of the change value of the output current of the power amplifier 2 associated with the aforementioned change in the load falls within a predefined permissible range, the emitter size of the transistor of the amplifier element 20 can be reduced.

As the emitter size of the transistor of the amplifier element 20 is reduced, the output impedance of the power amplifier 2 increases, and thus the conversion ratio of the impedance from the output terminal P1 of the power amplifier 2 to the input terminal P2 of the non-reciprocal circuit 3 can be made relatively small. Thus, the interstage matching circuit 7, which is connected between the output terminal P1 of the power amplifier 2 and the input terminal P2 of the non-reciprocal circuit 3, can be simplified. As the interstage matching circuit 7 is simplified, the insertion loss of the interstage matching circuit 7 can be reduced, and thus the efficiency of the transmission module 1 can be increased.

As the emitter size of the transistor of the amplifier element 20 at the output stage of the power amplifier 2 is reduced, the size of the power amplifier 20 can be reduced, and thus the size of the transmission module 1 can be reduced. In addition, as the emitter size of the transistor of the amplifier element 20 formed by a bipolar transistor is set as appropriate on the basis of the isolation characteristics of the non-reciprocal circuit 3, the output impedance of the power amplifier 2 can be set higher.

Although the input matching circuit 6 is connected to the input terminal P2 of the non-reciprocal circuit 3 in the embodiments described above, the input matching circuit 6 is not necessarily required. Therefore, in a case in which the input matching circuit 6 is not provided, the transmission module 1 may be configured such that the output impedance of the power amplifier 2 and the input impedance of the non-reciprocal circuit 3 are matched by the interstage matching circuit 7.

The present invention can be widely applied to a transmission module that includes an amplifier circuit, a non-reciprocal circuit, and an interstage matching circuit that is provided between an output end of the amplifier circuit and an input end of the non-reciprocal circuit.

1 TRANSMISSION MODULE
2 POWER AMPLIFIER (AMPLIFIER CIRCUIT)
3 NON-RECIPROCAL CIRCUIT
30, 130 ISOLATORS
31 FERRITE (MAGNETIC MEMBER)

33 FIRST CENTER ELECTRODE
34 SECOND CENTER ELECTRODE
35 INPUT PORT
36 OUTPUT PORT
4 BROADBAND CIRCUIT
41 LC SERIES RESONANT CIRCUIT
5 OUTPUT MATCHING CIRCUIT
6 INPUT MATCHING CIRCUIT
7 INTERSTAGE MATCHING CIRCUIT
C1 CAPACITOR (FIRST CAPACITOR)
C2 CAPACITOR (FOURTH CAPACITOR)
C5 CAPACITOR (SIXTH CAPACITOR)
Cj CAPACITOR (SECOND CAPACITOR)
CS1 CAPACITOR (FIFTH CAPACITOR)
CS2 CAPACITOR (THIRD CAPACITOR)
R TERMINATOR

The invention claimed is:

1. A transmission module comprising an amplifier circuit and a non-reciprocal circuit and an interstage matching circuit provided between an output end of the amplifier circuit and the input end of the non-reciprocal circuit,
wherein the non-reciprocal circuit includes
an isolator provided with an input port and an output port,
a broadband circuit disposed between the input port and the output port of the isolator, the broadband circuit being connected in parallel to the isolator, and
an output matching circuit connected in series to the output port of the isolator, wherein the isolator includes
a microwave magnetic body,
a first center electrode and a second center electrode disposed on the microwave magnetic body in a state in which the first center electrode and the second center electrode are isolated from each other while intersecting with each other, and
permanent magnets configured to apply a direct current magnetic field to a portion where the first center electrode and the second center electrode intersect with each other,
wherein the first center electrode is connected at one end to an input end of the non-reciprocal circuit and connected at another end to an input end of the output matching circuit,
wherein the second center electrode is connected at one end to the input end of the non-reciprocal circuit and grounded at another end,
wherein the broadband circuit includes
a first capacitor connected in parallel to the first center electrode, and
a series circuit connected in parallel to the first center electrode, the series circuit being formed by a terminator and an LC series resonant circuit,
wherein a second capacitor is connected in parallel to the non-reciprocal circuit,
wherein an input matching circuit is connected between the input end of the non-reciprocal circuit and an output end of the interstage matching circuit, and
wherein the input matching circuit is formed by a fifth capacitor that is connected at one end to the input end of the non-reciprocal circuit and connected at another end to the output end of the interstage matching circuit.

2. The transmission module according to claim 1, wherein the output matching circuit is formed by a third capacitor that is connected at one end to the another end of the first center electrode and connected at another end to an output end of the non-reciprocal circuit.

3. The transmission module according to claim 1, wherein the first capacitor and the series circuit are connected in parallel.

4. The transmission module according to claim 3, wherein the output matching circuit is formed by a third capacitor that is connected at one end to the another end of the first center electrode and connected at another end to an output end of the non-reciprocal circuit.

* * * * *

UNITED STATES PATENT AND TRADEMARK OFFICE
CERTIFICATE OF CORRECTION

| | |
|---|---|
| PATENT NO. | : 9,148,110 B2 |
| APPLICATION NO. | : 14/561342 |
| DATED | : September 29, 2015 |
| INVENTOR(S) | : Yuki Higashide et al. |

It is certified that error appears in the above-identified patent and that said Letters Patent is hereby corrected as shown below:

In the specification,

Column 6, line 48, please add -- 34 -- between "electrode" and "(inductor L2)"

Column 11, line 19, please replace "and3" with -- and 3 --

Signed and Sealed this
Third Day of May, 2016

Michelle K. Lee
*Director of the United States Patent and Trademark Office*